(12) United States Patent
Fu et al.

(10) Patent No.: US 10,784,181 B2
(45) Date of Patent: Sep. 22, 2020

(54) APPARATUS AND MANUFACTURING METHOD

(71) Applicant: Huawei Technologies Co., Ltd., Shenzhen (CN)

(72) Inventors: HuiLi Fu, Shenzhen (CN); Jyh Rong Lin, Zhubei (TW); Shujie Cai, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/905,044

(22) Filed: Feb. 26, 2018

(65) Prior Publication Data

US 2018/0190566 A1     Jul. 5, 2018

Related U.S. Application Data

(63) Continuation of application No. PCT/CN2016/096373, filed on Aug. 23, 2016.

(30) Foreign Application Priority Data

Aug. 27, 2015    (CN) .......................... 2015 1 0535388

(51) Int. Cl.
*H01L 23/373*      (2006.01)
*H01L 23/42*       (2006.01)
(Continued)

(52) U.S. Cl.
CPC ...... *H01L 23/3733* (2013.01); *H01L 21/4871* (2013.01); *H01L 23/3672* (2013.01);
(Continued)

(58) Field of Classification Search
None
See application file for complete search history.

(56) References Cited

U.S. PATENT DOCUMENTS

| | | | |
|---|---|---|---|
| 7,183,641 | B2 | 2/2007 | Renavikar et al. |
| 7,485,495 | B2 | 2/2009 | Renavikar et al. |

(Continued)

FOREIGN PATENT DOCUMENTS

| | | |
|---|---|---|
| CN | 1819172 A | 8/2006 |
| CN | 1871305 A | 11/2006 |

(Continued)

OTHER PUBLICATIONS

Foreign Communication From a Counterpart Application, European Application No. 16838559.9, Extended European Search Report dated Jul. 9, 2018, 8 pages.

(Continued)

*Primary Examiner* — Jack S Chen
(74) *Attorney, Agent, or Firm* — Conley Rose, P.C.

(57) ABSTRACT

An apparatus includes a circuit device, a heat sink fin, and a thermal interface material layer. The thermal interface material layer is thermally coupled to the circuit device and the heat sink fin. The thermal interface material layer includes a first alloy layer, a nanometal particle layer, and a second alloy layer. The first alloy layer is thermally coupled to the circuit device. The nanometal particle layer is thermally coupled to the first alloy layer. The nanometal particle layer includes nanometal particles and an intermediate mixture.

19 Claims, 4 Drawing Sheets

(51) Int. Cl.
*H01L 21/48* (2006.01)
*H01L 23/367* (2006.01)
(52) U.S. Cl.
CPC ...... *H01L 23/3735* (2013.01); *H01L 23/3736* (2013.01); *H01L 23/42* (2013.01); *H01L 21/4882* (2013.01); *H01L 2224/16225* (2013.01); *H01L 2224/73204* (2013.01); *H01L 2224/73253* (2013.01); *H01L 2924/15311* (2013.01); *H01L 2924/16152* (2013.01)

(56) References Cited

U.S. PATENT DOCUMENTS

| | | | |
|---|---|---|---|
| 7,535,099 B2 * | 5/2009 | Suh | H01L 23/3736 257/713 |
| 7,709,951 B2 | 5/2010 | Brodsky et al. | |
| 8,030,757 B2 | 10/2011 | Renavikar et al. | |
| 8,248,803 B2 | 8/2012 | Lin et al. | |
| 8,409,929 B2 | 4/2013 | Renavikar et al. | |
| 2005/0045855 A1 | 3/2005 | Tonapi et al. | |
| 2005/0049357 A1 | 3/2005 | Zhong et al. | |
| 2007/0131913 A1 | 6/2007 | Cheng et al. | |
| 2008/0073776 A1 | 3/2008 | Suh et al. | |
| 2008/0145607 A1 | 6/2008 | Kajiwara et al. | |
| 2008/0303161 A1 | 12/2008 | Kobayashi et al. | |
| 2009/0096100 A1 | 4/2009 | Kajiwara et al. | |
| 2010/0327430 A1 | 12/2010 | Jadhav et al. | |
| 2012/0305632 A1 | 12/2012 | Ross et al. | |
| 2013/0328204 A1 | 12/2013 | Zommer | |
| 2015/0014836 A1 | 1/2015 | Blackshear et al. | |
| 2015/0041827 A1 | 2/2015 | Iwata et al. | |

FOREIGN PATENT DOCUMENTS

| | | |
|---|---|---|
| CN | 1875480 A | 12/2006 |
| CN | 101159251 A | 4/2008 |
| CN | 101930953 A | 12/2010 |
| CN | 102867793 A | 1/2013 |
| CN | 104538321 A | 4/2015 |
| CN | 105355610 A | 2/2016 |
| EP | 1684340 A2 | 7/2006 |

OTHER PUBLICATIONS

Machine Translation and Abstract of Chinese Publication No. CN102867793, dated Jan. 9, 2013, 6 pages.
Machine Translation and Abstract of Chinese Publication No. CN104538321, dated Apr. 22, 2015, 15 pages.
Machine Translation and Abstract of Chinese Publication No. CN105355610, dated Feb. 24, 2016, 16 pages.
Wang, T., et al, "Low-Temperature Sintering with Nano-Silver Paste in Die-Attached Interconnection," Journal of Electronic Materials, vol. 36, No. 10, 2007, pp. 1333-1340.
Foreign Communication From a Counterpart Application, PCT Application No. PCT/CN2016/096373, English Translation of International Search Report dated Nov. 29, 2016 3 pages.
Foreign Communication From a Counterpart Application, PCT Application No. PCT/CN2016/096373, English Translation of Written Opinion dated Nov. 29, 2016, 8 pages.

* cited by examiner

APPARATUS AND MANUFACTURING METHOD

CROSS-REFERENCE TO RELATED APPLICATIONS

This application is a continuation of International Patent Application No. PCT/CN2016/096373 filed on Aug. 23, 2016, which claims priority to Chinese Patent Application No. 201510535388.X filed on Aug. 27, 2015. The disclosures of the aforementioned applications are hereby incorporated by reference in their entireties.

TECHNICAL FIELD

The present disclosure relates to the circuit field, and in particular, to a circuit apparatus and a manufacturing method.

BACKGROUND

FIG. 1A is a schematic sectional view of an integrated circuit chip 1A02 and a partial packaging structure of the integrated circuit chip 1A02. The structure includes the integrated circuit chip 1A02, a thermal interface material layer 1A04, and a heat sink device 1A06. Heat generated by the integrated circuit chip 1A02 in an operating process is dissipated to the heat sink device 1A06 using the thermal interface material layer 1A04 on a rear surface of the integrated circuit chip 1A02. Therefore, a heat conduction capability of the thermal interface material layer 1A04 significantly affects heat dissipation of the integrated circuit chip 1A02. The thermal interface material layer 1A04 includes a silver adhesive material. Metal silver particles 1A08 are mixed in the silver adhesive material to improve an effect of heat conduction, but the effect of heat conduction mainly depends on continuous phases formed by the silver adhesive material. The silver adhesive material has a low thermal conductivity, and can hardly satisfy a heat dissipation requirement of a high-power chip.

SUMMARY

Embodiments of the present disclosure provide an apparatus and a manufacturing method. In the apparatus, a thermal interface material between a circuit device and a heat sink fin has a relatively high thermal conductivity, greatly improves heat conduction efficiency of an entire heat path, and can better satisfy a heat dissipation requirement of a circuit device having high power consumption.

According to a first aspect, an embodiment of the present disclosure provides an apparatus, including a circuit device, a heat sink fin, and a thermal interface material layer, thermally coupled to the circuit device and the heat sink fin, and including a first alloy layer, thermally coupled to the circuit device, a nanometal particle layer, thermally coupled to the first alloy layer, where the nanometal particle layer includes multiple nanometal particles that are coupled to each other and an intermediate mixture, and the intermediate mixture is filled between the multiple nanometal particles, and a second alloy layer, thermally coupled to the nanometal particle layer and the heat sink fin.

In a first possible implementation manner of the first aspect, a sintered continuous phase structure is formed at a contact portion between the first alloy layer and the nanometal particle layer, sintered continuous phase structures are formed at contact portions between the multiple nanometal particles, and a sintered continuous phase structure is formed at a contact portion between the second alloy layer and the nanometal particle layer.

With reference to the first aspect or the first possible implementation manner of the first aspect, in a second possible implementation manner, the nanometal particles include silver.

With reference to any one of the first aspect, or the first to the second possible implementation manners of the first aspect, in a third possible implementation manner, diameters of the nanometal particles are between 50 nanometers (nm) and 200 nm.

With reference to any one of the first aspect, or the first to the third possible implementation manners of the first aspect, in a fourth possible implementation manner, the apparatus is applied to a flip chip ball grid array structure.

With reference to any one of the first aspect, or the first to the fourth possible implementation manners of the first aspect, in a fifth possible implementation manner, the first alloy layer includes a first adhesive layer and a first co-sintered layer, the first adhesive layer is thermally coupled to the circuit device, the first co-sintered layer is coupled to the nanometal particle layer, and a sintered continuous phase structure is formed at a contact portion between the first co-sintered layer and the nanometal particle layer.

With reference to the fifth possible implementation manner of the first aspect, in a sixth possible implementation manner, the first adhesive layer includes any one of the materials titanium, chromium, nickel, or a nickel-vanadium alloy, and the first co-sintered layer includes any one of the materials silver, gold, or copper.

With reference to either of the fifth possible implementation manner and the sixth possible implementation manner of the first aspect, in a seventh possible implementation manner, the first alloy layer further includes a first buffer layer located between the first adhesive layer and the first co-sintered layer, and the first buffer layer includes any one of the materials aluminum, copper, nickel, or a nickel-vanadium alloy.

With reference to any one of the first aspect, or the first to the seventh possible implementation manners of the first aspect, in an eighth possible implementation manner, the second alloy layer includes a second adhesive layer and a second co-sintered layer, the second adhesive layer is thermally coupled to the heat sink fin, the second co-sintered layer is thermally coupled to the nanometal particle layer, and a sintered continuous phase structure is formed at a contact portion between the second co-sintered layer and the nanometal particle layer.

With reference to the eighth possible implementation manner of the first aspect, in a ninth possible implementation manner, the second adhesive layer includes any one of the materials titanium, chromium, nickel, or a nickel-vanadium alloy, and the second co-sintered layer includes any one of the materials silver, gold, or copper.

With reference to either of the eighth possible implementation manner and the ninth possible implementation manner of the first aspect, in a tenth possible implementation manner, the second alloy layer further includes a second buffer layer located between the second adhesive layer and the second co-sintered layer, and the second buffer layer includes any one of the materials aluminum, copper, nickel, or a nickel-vanadium alloy.

With reference to any one of the first aspect, or the first to the tenth possible implementation manners of the first aspect, in an eleventh possible implementation manner, diameters of the nanometal particles are not greater than 1 micrometer (μm).

With reference to any one of the first aspect, or the first to the eleventh possible implementation manners of the first aspect, in a twelfth possible implementation manner, the intermediate mixture includes any one of the materials air or resin.

With reference to any one of the first aspect, or the first to the twelfth possible implementation manners of the first aspect, in a thirteenth possible implementation manner, the circuit device includes an integrated circuit die, and a substrate of the integrated circuit die is thermally coupled to thermal interface material layer.

According to a second aspect, an embodiment of the present disclosure provides a method for manufacturing an apparatus, including generating a first alloy layer, generating a nanometal particle layer using multiple nanometal particles that are coupled to each other and an intermediate mixture, and filling the intermediate mixture between the multiple nanometal particles, and generating a second alloy layer, thermally coupling the first alloy layer to the circuit device, thermally coupling the nanometal particle layer to the first alloy layer, and thermally coupling the second alloy layer to the nanometal particle layer and the heat sink fin.

In a first possible implementation manner of the second aspect, the method further includes forming a sintered continuous phase structure at a contact portion between the first alloy layer and the nanometal particle layer, forming sintered continuous phase structures at contact portions between the nanometal particles, and forming a sintered continuous phase structure at a contact portion between the second alloy layer and the nanometal particle layer.

With reference to the second aspect or the first possible implementation manner of the second aspect, in a second possible implementation manner, diameters of the nanometal particles are not greater than 1 micrometer.

With reference to any one of the second aspect, or the first to the second possible implementation manners of the second aspect, in a third possible implementation manner, the intermediate mixture includes any one of the materials air or resin.

With reference to any one of the second aspect, or the first to the third possible implementation manners of the second aspect, in a fourth possible implementation manner, the generating a first alloy layer includes generating a first adhesive layer and a first co-sintered layer, thermally coupling the first adhesive layer to the circuit device, coupling the first co-sintered layer to the nanometal particle layer, and forming a sintered continuous phase structure at a contact portion between the first co-sintered layer and the nanometal particle layer.

With reference to any one of the second aspect, or the first to the fourth possible implementation manners of the second aspect, in a fifth possible implementation manner, the generating a second alloy layer includes generating a second adhesive layer and a second co-sintered layer, thermally coupling the second adhesive layer to the heat sink fin, thermally coupling the second co-sintered layer to the nanometal particle layer, and forming a sintered continuous phase structure at a contact portion between the second co-sintered layer and the nanometal particle layer.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1A:
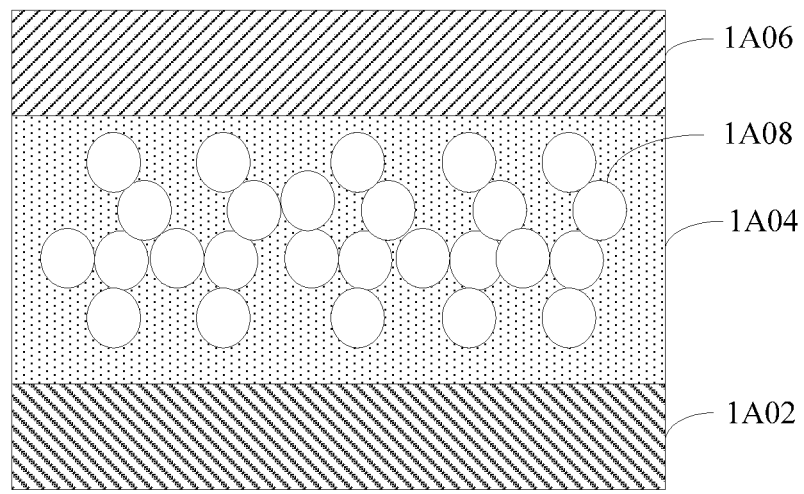
FIG. 1A is a schematic sectional view of a packaging structure that includes an apparatus.
Figure 1B:
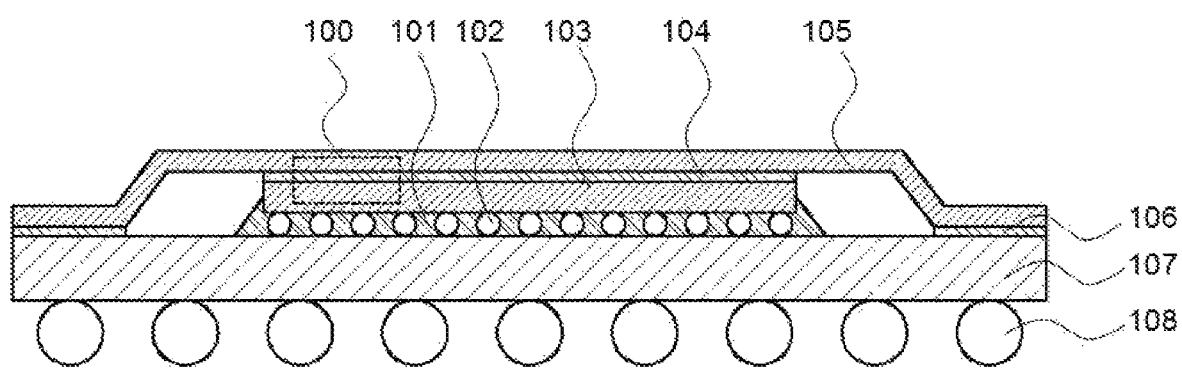
FIG. 1B is a schematic sectional view of a packaging structure that includes an apparatus according to a first embodiment of the present disclosure.

FIG. 1B is a schematic sectional view of a packaging structure 100 that includes an apparatus according to a first embodiment of the present disclosure. A flip chip ball grid array packaging structure includes a solder ball 108, a substrate 107, an adhesive 106, a metal bump 102, an integrated circuit die 103, a thermal interface material layer 104, and a heat sink fin 105. The integrated circuit die 103 is coupled to the substrate 107 using the metal bump 102. The metal bump 102 is protected by a bottom filler 101. The heat sink fin 105 is fastened on the substrate 107 using the adhesive 106. The thermal interface material layer 104 is thermally coupled to the integrated circuit die 103 and the heat sink fin 105. In this specification, thermal coupling includes scenarios in which there is heat conduction between different layers, structures, or apparatuses. Furthermore, the thermal interface material layer 104 may be located between the integrated circuit die 103 and the heat sink fin 105. A substrate of the integrated circuit die 103 is thermally coupled to the thermal interface material layer 104. Heat of the integrated circuit die 103 reaches the heat sink fin 105 using the thermal interface material layer 104.

The integrated circuit die 103, the thermal interface material layer 104, and the heat sink fin 105 may be used as a part or all components of an apparatus, and the apparatus may be applied to, but is not limited to, the flip chip ball grid array packaging structure shown in the FIG. 1B.

Figure 2:
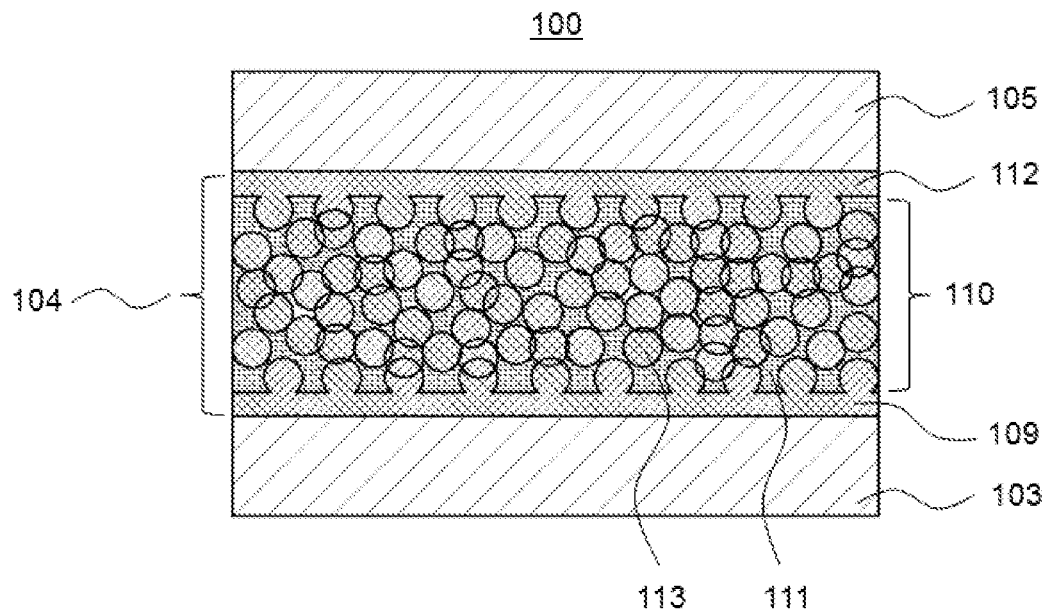
FIG. 2 is a schematic sectional view of a first embodiment of a thermal interface material layer in FIG. 1B.

FIG. 2 is a schematic sectional view of a first embodiment of the thermal interface material layer 104 in FIG. 1B. The thermal interface material layer 104 is thermally coupled to the integrated circuit die 103 and the heat sink fin 105, and includes a first alloy layer 109, a nanometal particle layer 110, and a second alloy layer 112.

The first alloy layer 109 is thermally coupled to the integrated circuit die 103 and the nanometal particle layer 110. Furthermore, as shown in the FIG. 2, the first alloy layer 109 may be located on the integrated circuit die 103, and under the nanometal particle layer 110. That is, the first alloy layer 109 may be located between the integrated circuit die 103 and the nanometal particle layer 110. The first alloy layer 109 increases adhesive strength between the integrated circuit die 103 and the nanometal particle layer 110.

The nanometal particle layer 110 includes nanometal particles 113 and an intermediate mixture 111. The intermediate mixture 111 includes, but is not limited to, any one of the materials air or resin. The intermediate mixture 111 is filled between multiple nanometal particles 113, and is used to enable the multiple nanometal particles 113 to become a whole. The nanometal particles 113 include, but are not limited to, silver. Diameters of the nanometal particles 113 are not greater than 1 μm. In an embodiment, the diameters of the nanometal particles 113 are between 50 nm and 200 nm. The nanometal particle layer 110 has a relatively low thermal resistance, and forms a relatively desirable heat conduction path.

The second alloy layer 112 is thermally coupled to the nanometal particle layer 110 and the heat sink fin 105. Furthermore, as shown in FIG. 2, the second alloy layer 112 may be located on the nanometal particle layer 110, and under the heat sink fin 105. That is, the second alloy layer 112 may be located between the nanometal particle layer 110 and the heat sink fin 105. The second alloy layer 112 increases adhesive strength between the nanometal particle layer 110 and the heat sink fin 105.

In an embodiment, a sintered continuous phase structure is formed at a contact portion between the first alloy layer 109 and the nanometal particle layer 110, sintered continuous phase structures are formed at contact portions between the nanometal particles, and a sintered continuous phase structure is formed at a contact portion between the second alloy layer 112 and the nanometal particle layer 110. The sintered continuous phase structure in this specification includes, but is not limited to, a whole structure formed by metal particles when metal atoms near contact portions of metal particles spread to metal particle interfaces and fuse with the metal particle interfaces because the metal particles are sintered.

Figure 3:
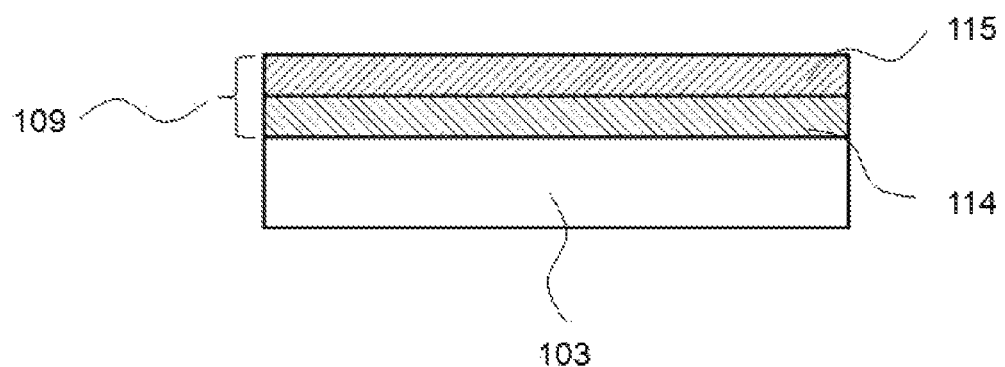
FIG. 3 is a schematic sectional view of a first embodiment of a first alloy layer in FIG. 2.

FIG. 3 is a schematic sectional view of a first embodiment of the first alloy layer 109 in FIG. 2. As shown in FIG. 3, the first alloy layer 109 includes a first adhesive layer 114 and a first co-sintered layer 115. A co-sintered layer in this specification includes, but is not limited to, a metal layer that is generated in a packaging process and that fuses with a thermal interface material layer, and the metal layer and particles in the thermal interface material layer are co-sintered to form a heat flux path. The first adhesive layer 114 is thermally coupled to the integrated circuit die 103. The first co-sintered layer 115 is thermally coupled to the nanometal particle layer 110. A sintered continuous phase structure is formed at a contact portion between the first co-sintered layer 115 and the nanometal particle layer 110. Further, the first adhesive layer 114 may be located on the integrated circuit die 103, and the first co-sintered layer 115 may be located on the first adhesive layer 114, and under the nanometal particle layer 110. The first adhesive layer 114 includes, but is not limited to, any one of the materials titanium, chromium, nickel, or nickel/vanadium. The first adhesive layer 114 increases adhesive strength between the integrated circuit die 103 and the first co-sintered layer 115. The first co-sintered layer 115 includes, but is not limited to, any one of the materials silver, gold, or copper.

Figure 4:
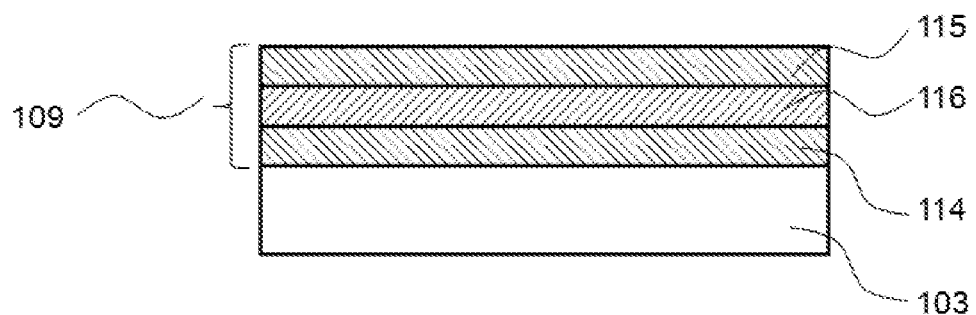
FIG. 4 is a schematic sectional view of a second embodiment of the first alloy layer in FIG. 2.

FIG. 4 is a schematic sectional view of a second embodiment of the first alloy layer 109 in FIG. 2. Compared with FIG. 3, the first alloy layer 109 in FIG. 4 further includes a first buffer layer 116 located between the first adhesive layer 114 and the first co-sintered layer 115. The first buffer layer 116 includes, but is not limited to, any one of the materials aluminum, copper, or nickel. The first buffer layer 116 provides a stress buffering function in a deformation caused by heat processing, and reduces a risk of a crack that appears between the integrated circuit die 103 and the thermal interface material layer 104, or in the middle of the thermal interface material layer 104, thereby increasing reliability of the apparatus.

Figure 5:
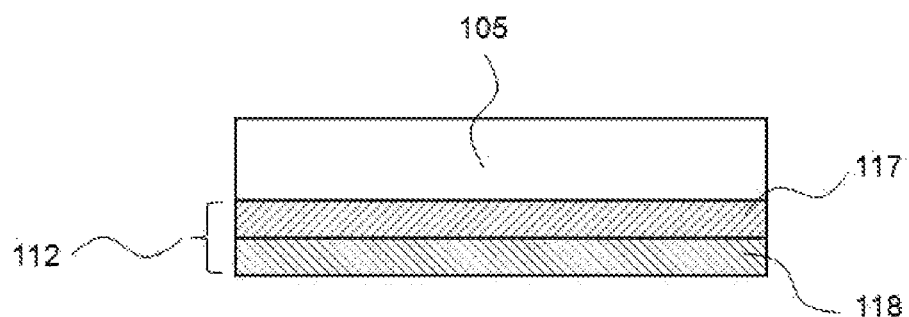
FIG. 5 is a schematic sectional view of a first embodiment of a second alloy layer in FIG. 2.

FIG. 5 is a schematic sectional view of a first embodiment of the second alloy layer 112 in FIG. 2. As shown in the FIG. 5, the second alloy layer 112 includes a second co-sintered layer 118 and a second adhesive layer 117. The second co-sintered layer 118 is thermally coupled to the nanometal particle layer 110. A sintered continuous phase structure is formed at a contact portion between the second co-sintered layer 118 and the nanometal particle layer 110. The second adhesive layer 117 is thermally coupled to the heat sink fin 105. Further, the second co-sintered layer 118 may be located on the nanometal particle layer 110, and the second adhesive layer 117 may be located on the second co-sintered layer 118, and under the heat sink fin 105. The second co-sintered layer 118 includes, but is not limited to, any one of the materials silver, gold, or copper. The second adhesive layer 117 includes, but is not limited to, any one of the materials titanium, chromium, nickel, or nickel/vanadium. The second adhesive layer 117 increases adhesive strength between the second co-sintered layer 115 and the heat sink fin 105.

Figure 6:
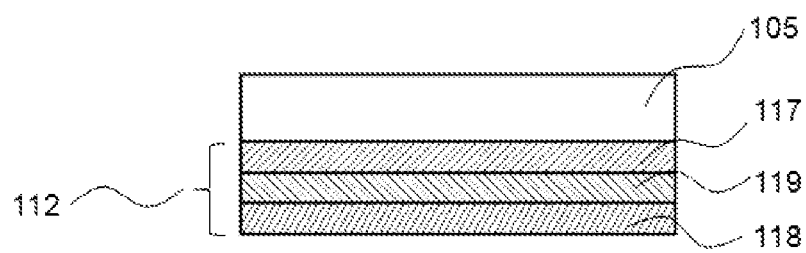
FIG. 6 is a schematic sectional view of a second embodiment of the second alloy layer in FIG. 2.

FIG. 6 is a schematic sectional view of a second embodiment of the second alloy layer 112 in FIG. 2. Compared with FIG. 5, the second alloy layer 112 in FIG. 6 further includes a second buffer layer 119 located between the second adhesive layer 117 and the second co-sintered layer 118. The second buffer layer 119 includes, but is not limited to, any one of the materials aluminum, copper, nickel, or nickel/vanadium. The second buffer layer 119 provides a buffering function in a deformation caused by heat processing, and reduces a risk of a crack that appears between the thermal interface material layer 104 and the heat sink fin 105, or in the middle of the thermal interface material layer 104, thereby increasing reliability of the apparatus.

In conclusion, because the thermal interface material layer in this embodiment of the present disclosure no longer includes a polymer material having a relatively low heat conductivity in a silver adhesive material, but instead, includes nanometal particles, the thermal interface material in this embodiment of the present disclosure has a relatively high thermal conductivity, greatly improves heat conduction efficiency of an entire heat path, and can better satisfy a heat dissipation requirement of a chip having high power consumption.

Figure 7:
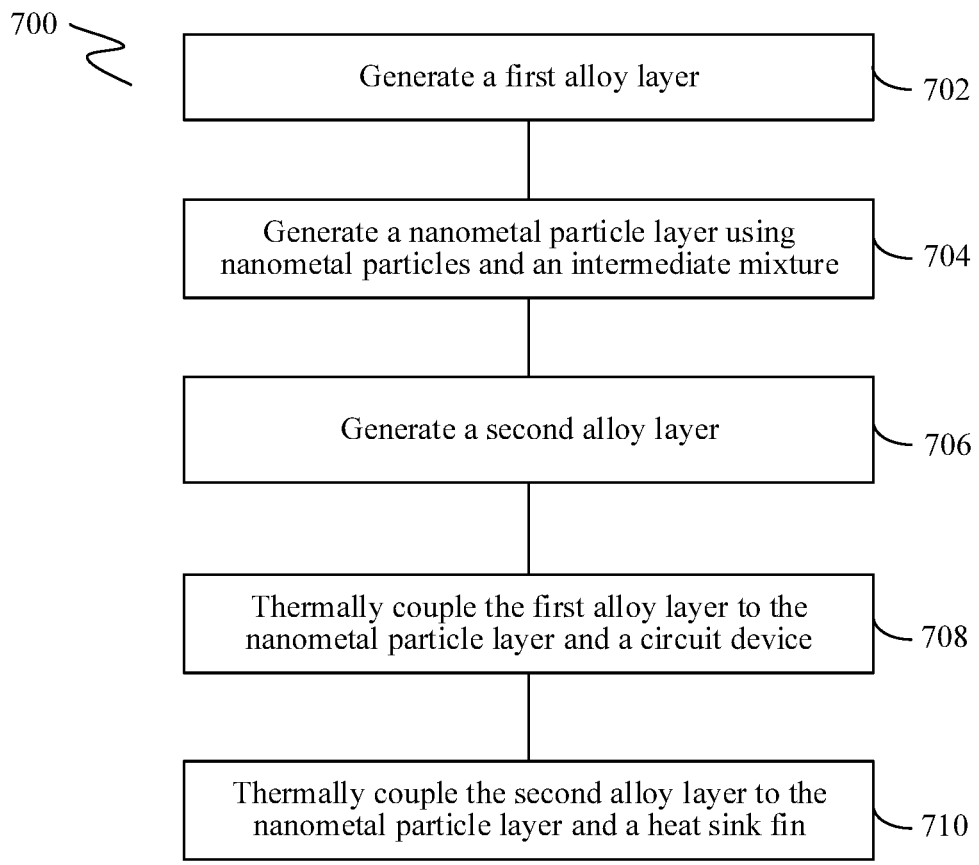
FIG. 7 is a flowchart of a method for manufacturing an apparatus according to a second embodiment of the present disclosure.

FIG. 7 is a flowchart 700 of a method for manufacturing an apparatus according to a second embodiment of the present disclosure. As shown in FIG. 7, the method 700 includes the following steps.

Step 702: Generate a first alloy layer.

Step 704: Generate a nanometal particle layer using nanometal particles and an intermediate mixture. Diameters of the nanometal particles are not greater than 1 μm. For example, the diameters of the nanometal particles are between 50 nm and 200 nm. The intermediate mixture includes, but is not limited to, any one of the materials air or resin. In an embodiment, the nanometal particles include, but are not limited to, silver.

Step 706: Generate a second alloy layer.

Step 708: Thermally couple the first alloy layer to the nanometal particle layer and the circuit device.

Step 710: Thermally couple the second alloy layer to the nanometal particle layer and a heat sink fin.

In an embodiment, the method further includes forming a sintered continuous phase structure at a contact portion between the first alloy layer and the nanometal particle layer, forming sintered continuous phase structures at contact portions between the nanometal particles, and forming a sintered continuous phase structure at a contact portion between the second alloy layer and the nanometal particle layer.

In an embodiment, the method may be applied to, but is not limited to, a flip chip ball grid array structure.

In an embodiment, the generating a first alloy layer includes generating a first adhesive layer and a first co-sintered layer, thermally coupling the first adhesive layer to the circuit device, coupling the first co-sintered layer to the nanometal particle layer, and forming a sintered continuous phase structure at a contact portion between the first co-sintered layer and the nanometal particle layer. The first adhesive layer includes, but is not limited to, any one of the materials titanium, chromium, nickel, or nickel/vanadium. The first co-sintered layer includes, but is not limited to, any one of the following materials silver, gold, or copper. In another embodiment, generating a first alloy layer further includes generating a first buffer layer between the first adhesive layer and the first co-sintered layer. The first buffer layer includes, but is not limited to, any one of the following materials aluminum, copper, nickel, or nickel/vanadium.

In an embodiment, the generating a second alloy layer includes generating a second adhesive layer and a second co-sintered layer, thermally coupling the second adhesive layer to the heat sink fin, thermally coupling the second co-sintered layer to the nanometal particle layer, and forming a sintered continuous phase structure at a contact portion between the second co-sintered layer and the nanometal particle layer. The second adhesive layer includes, but is not limited to, any one of the following materials titanium, chromium, nickel, or nickel/vanadium. The second co-sintered layer includes, but is not limited to, any one of the following materials silver, gold, or copper. In another embodiment, the generating a second alloy layer further includes generating a second buffer layer between the second adhesive layer and the second co-sintered layer. The second buffer layer includes, but is not limited to, any one of the materials aluminum, copper, nickel, or nickel/vanadium.

The circuit device may include an integrated circuit die. Thermally coupling the first alloy layer to the circuit device includes thermally coupling the first alloy layer to a substrate of the integrated circuit die.

What is disclosed above is merely exemplary embodiments of the present disclosure, and certainly is not intended to limit the protection scope of the present disclosure. Therefore, equivalent variations made in accordance with the claims of the present disclosure shall fall within the scope of the present disclosure.

What is claimed is:

1. An apparatus, comprising:
   a circuit device;
   a heat sink fin; and
   a thermal interface material layer, wherein the thermal interface material layer is thermally coupled to the circuit device and the heat sink fin and comprises:
      a first alloy layer thermally coupled to the circuit device;
      a nanometal particle layer thermally coupled to the first alloy layer, wherein the nanometal particle layer comprises a plurality of nanometal particles that are coupled to each other and an intermediate mixture, and wherein the intermediate mixture is filled with the nanometal particles; and
      a second alloy layer thermally coupled to the nanometal particle layer and the heat sink fin, wherein the second alloy layer comprises:
         a second adhesive layer thermally coupled to the heat sink fin;
         a second co-sintered layer thermally coupled to the nanometal particle layer, wherein a sintered continuous phase structure is formed at a contact portion between the second co-sintered layer and the nanometal particle layer, and
         a second buffer layer located between the second adhesive layer and the second co-sintered layer.

2. The apparatus according to claim 1, wherein a second sintered continuous phase structure is formed at a contact portion between the first alloy layer and the nanometal particle layer, wherein sintered continuous phase structures are formed at contact portions among the nanometal particles.

3. The apparatus according to claim 1, wherein the nanometal particles comprise silver.

4. The apparatus according to claim 1, wherein diameters of the nanometal particles are between 50 nanometers (nm) and 200 nm.

5. The apparatus according to claim 1, wherein the apparatus is applied to a flip chip ball grid array structure.

6. The apparatus according to claim 1, wherein the first alloy layer comprises a first adhesive layer and a first co-sintered layer, wherein the first adhesive layer is thermally coupled to the circuit device, wherein the first co-sintered layer is coupled to the nanometal particle layer, and wherein another sintered continuous phase structure is formed at a contact portion between the first co-sintered layer and the nanometal particle layer.

7. The apparatus according to claim 6, wherein the first adhesive layer comprises at one of titanium, chromium, nickel, or a nickel-vanadium alloy, and wherein the first co-sintered layer comprises at least one of silver, gold, or copper.

8. The apparatus according to claim 6, wherein the first alloy layer further comprises a first buffer layer located between the first adhesive layer and the first co-sintered layer, and wherein the first buffer layer comprises at least one of aluminum, copper, nickel, or a nickel-vanadium alloy.

9. The apparatus according to claim 1, wherein the second adhesive layer comprises at least one of titanium, chromium, nickel, or a nickel-vanadium alloy, and wherein the second co-sintered layer comprises at least one of silver, gold, or copper.

10. The apparatus according to claim 1, wherein the second buffer layer comprises at least one of aluminum, copper, nickel, or a nickel-vanadium alloy.

11. The apparatus according to claim 1, wherein the intermediate mixture comprises at least one of air or resin.

12. The apparatus according to claim 1, wherein the circuit device comprises an integrated circuit die, and wherein a substrate of the integrated circuit die is thermally coupled to thermal interface material layer.

13. An apparatus, comprising:
a heat sink fin; and
a thermal interface material layer, wherein the thermal interface material layer is thermally coupled to the heat sink fin and comprises:
a first alloy layer;
a nanometal particle layer thermally coupled to the first alloy layer, wherein the nanometal particle layer comprises a plurality of nanometal particles that are coupled to each other and an intermediate mixture, and wherein the intermediate mixture is filled with the nanometal particles; and
a second alloy layer thermally coupled to the nanometal particle layer and the heat sink fin, wherein the second alloy layer comprises:
a second adhesive layer thermally coupled to the heat sink fin;
a second co-sintered layer thermally coupled to the nanometal particle layer, wherein a sintered continuous phase structure is formed at a contact portion between the second co-sintered layer and the nanometal particle layer; and
a second buffer layer located between the second adhesive layer and the second co-sintered layer.

14. The apparatus according to claim 13, wherein a second sintered continuous phase structure is formed at a contact portion between the first alloy layer and the nanometal particle layer, wherein the second sintered continuous phase structures are formed at contact portions among the nanometal particles.

15. The apparatus according to claim 13, wherein the nanometal particles comprise silver.

16. The apparatus according to claim 13, wherein diameters of the nanometal particles are between 50 nanometers (nm) and 200 nm.

17. The apparatus according to claim 13, wherein the apparatus is applied to a flip chip ball grid array structure.

18. The apparatus according to claim 13, wherein the first alloy layer comprises a first adhesive layer and a first co-sintered layer, wherein the first co-sintered layer is coupled to the nanometal particle layer, and wherein another sintered continuous phase structure is formed at a contact portion between the first co-sintered layer and the nanometal particle layer.

19. The apparatus according to claim 18, wherein the first adhesive layer comprises at least one of titanium, chromium, nickel, or a nickel-vanadium alloy, and wherein the first co-sintered layer comprises at least one of silver, gold, or copper.

* * * * *